United States Patent [19]

Solfest et al.

[11] Patent Number: 4,916,022
[45] Date of Patent: Apr. 10, 1990

[54] TITANIA DOPED CERAMIC THERMAL BARRIER COATINGS

[75] Inventors: Patricia A. Solfest, Chandler; Thomas E. Strangman, Phoenix, both of Ariz.

[73] Assignee: Allied-Signal Inc., Morris Township, Morris County, N.J.

[21] Appl. No.: 267,209

[22] Filed: Nov. 3, 1988

[51] Int. Cl.[4] .............................................. B32B 15/04
[52] U.S. Cl. ..................................... 428/623; 428/632; 428/633; 428/678; 428/680; 428/938; 416/241 B
[58] Field of Search ............... 428/623, 632, 633, 660, 428/678, 680, 938; 416/241 B

[56] References Cited

U.S. PATENT DOCUMENTS

| | | | |
|---|---|---|---|
| 3,049,432 | 8/1962 | Weber | 501/103 |
| 3,928,026 | 12/1975 | Hecht et al. | 428/615 |
| 4,005,989 | 2/1977 | Preston | 428/651 |
| 4,055,705 | 10/1977 | Stecura et al. | 428/633 |
| 4,321,310 | 3/1982 | Ulion et al. | 428/612 |
| 4,321,311 | 3/1982 | Strangman | 428/633 |
| 4,328,285 | 5/1982 | Siemers et al. | 428/633 |
| 4,339,509 | 7/1982 | Dardi et al. | 428/632 |
| 4,447,503 | 5/1984 | Dardi et al. | 428/632 |
| 4,576,874 | 3/1986 | Spengler et al. | 428/623 |
| 4,639,399 | 1/1987 | Aprigliano | 428/623 |
| 4,645,716 | 2/1987 | Harrington et al. | 428/472 |
| 4,715,902 | 12/1987 | Allam et al. | 148/242 |
| 4,758,542 | 7/1988 | Parker | 501/134 |
| 4,774,150 | 9/1988 | Amano et al. | 428/633 |

FOREIGN PATENT DOCUMENTS 38603 2/1988 Japan ........................ 416/241 B

Primary Examiner—L. Dewayne Rutledge
Assistant Examiner—George Wyszomierski
Attorney, Agent, or Firm—R. Steven Linne; James W. McFarland; Robert A. Walsh

[57] ABSTRACT

A ceramic thermal barrier coating system for superalloy components subjected to high operating temperatures, such as gas turbine engine airfoils, is disclosed which includes a titania doped interfacial layer between the metallic substrate and the ceramic overcoat in order to better resist failure by spalling.

7 Claims, 1 Drawing Sheet

TITANIA DOPED CERAMIC THERMAL BARRIER COATINGS

This invention was made with U.S. Government support under contract number F33615-85-C-5155 awarded by the U.S. Department of the Air Force, Wright Aeronautical Laboratories. The U.S. Government has certain rights in this invention.

TECHNICAL FIELD

This invention relates generally to ceramic coating systems for metal substrates and more specifically to protective, multi-layer, ceramic thermal barrier coating systems for metallic components of gas turbine engines, such as superalloy blades and vanes.

BACKGROUND OF THE INVENTION

As is well known, the power and efficiency of gas turbine engines typically increases with increasing nominal operating temperature, but the ability of the turbine to operate at increasingly higher temperatures is limited by the ability of the turbine components, especially the vanes and blades, to withstand the heat, oxidation and corrosion effects of the impinging hot gas stream and still maintain sufficient mechanical strength. Thus, there exists a continuing need to find advanced material systems for use in components that will function satisfactorily in high performance gas turbines, which operate at higher temperatures and stresses.

One approach to providing improved turbine components is to fabricate a strong, stable substrate having the shape of the component, and cover the substrate with a thin protective coating that resists the oxidation and corrosion effects of the hot combustion gas stream. The underlying substrates, usually nickel-base or cobalt-base superalloy compositions, were at one time formed by common forging or simple casting procedures but now improved performance results from use of cooled airfoils made by directional solidification or directional recrystallization procedures. Even greater operating temperatures are possible by casting the substrate as a single crystal having no grain boundaries which might cause premature failure, and with the single crystal orientation selected to meet required creep-rupture and fatigue lives.

Insulative ceramic coatings further enhance turbine performance by reducing heat transferred into cooled airfoils, reducing the requirement for cooling air, which is a performance penalty. Durability of turbine components is also enhanced by ceramic coatings that minimize metal temperatures and thermal stresses in the superalloy component.

A modern ceramic coating system typically has several layers of differing compositions, and properties, in order to provide the best combination of benefits. For example, one layer may be relatively thick and porous to provide an insulative effect but, by itself, offering little resistance to oxidation, erosion, or corrosion. The outer surface of such a layer may be protected from erosion by providing a thin, hard, dense surface layer.

Generally, a thin metallic layer or bond coating is applied under the ceramic to protect the substrate through formation of an adherent oxide scale, such as aluminum oxide, which resists the oxidizing effects of the hot combustion gas stream. Other elements present in the coating contribute to the ability of the protective ceramic coating to adhere to the substrate through many cycles of gas turbine startup and shut down.

Lives of ceramic coatings are limited at high temperatures due to excessive growth of the oxide scale on the bond coating and flaws which develop within the interfacial zone between the metallic bond coating and insulative ceramic layer. Thermally induced deterioration of the interfacial zone coupled with thermal and ceramic-superalloy thermal expansion mismatch stresses eventually lead to spalling of the insulative layer.

It should be apparent from the foregoing general discussion of the art, that further improvements, in both the effectiveness and useful life, of coating systems are required in order to survive the increasingly severe operating conditions in high performance gas turbine engines.

It is therefore an object of the present invention to provide a new and improved ceramic based coating system for use on gas turbine engine components.

Another object of this invention is to increase the cyclic oxidation life of ceramic coatings on gas turbine airfoils.

A further object of this invention is to provide improved methods of applying ceramic coatings to metallic substrates.

SUMMARY OF THE INVENTION

The present invention aims to improve upon the prior art by providing a novel ceramic-based, thermal barrier coating system for superalloy turbine components such as blades and vanes. The coating includes several layers which act synergistically to provide a significant increase in the cyclic oxidation life of the component. Basically, the layers include: a metallic bond or barrier coating, such as MCrAlY, having an alumina oxide scale thereon, an interfacial layer containing small amounts of titanium (present as titania), and an insulative overcoat such as a columnar grained, yttria stabilized zirconia ceramic outer layer. The preferred method of coating the components is by means of an electron-beam, physical vapor deposition process so that titanium may efficiently be added to the interfacial layer by doping the zirconia with a second vapor source of titanium while applying the columnar grained layer. Coatings may also be deposited by other physical vapor deposition processes, such as sputtering.

This new coating system provides double the life of prior art EB-PVD applied thermal barrier coatings when exposed to thermal cycling in burner rig testing. While the inventors do not wish to be held to any particular theory, it is believed that the presence of from about 0.1% to 10% of titanium oxide in the interfacial layer may significantly reduce the rate of oxygen diffusion through the alumina scale on the bond coating, which may contribute to improved adhesion and/or oxidation resistance. Titania also promotes sintering of zirconia which may contribute to improved adhesion of the insulative overcoat to the alumina scale.

BRIEF DESCRIPTION OF THE DRAWINGS

While this specification concludes with claims particularly pointing out and distinctly claiming the subject matter which is regarded as the invention, it is believed that the objects, features, and advantages thereof may be better understood from the following detailed description of a presently preferred embodiment when taken in connection with the accompanying drawings in which:

BEST MODE FOR CARRYING OUT THE INVENTION

Figure 1:
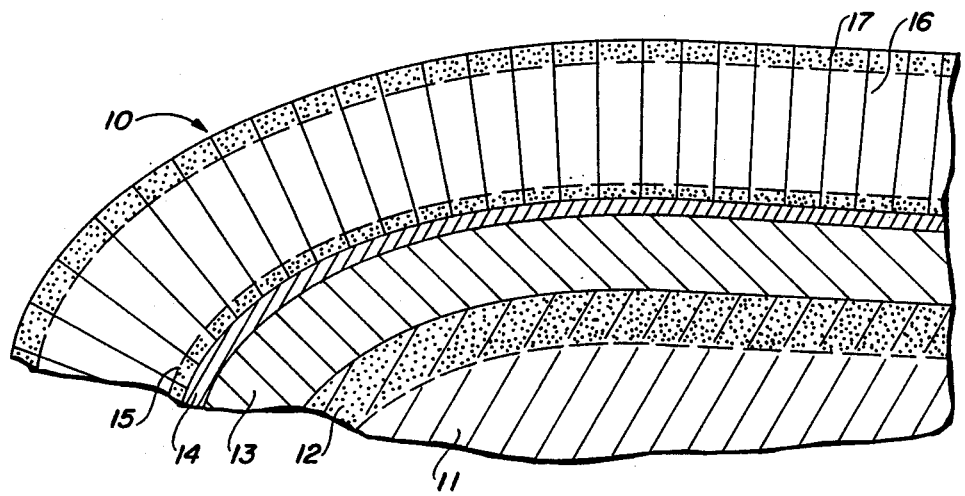
FIG. 1 is an enlarged fragmented sectional view through a turbine component illustrating the several layers of the present coating system.

Referring to FIG. 1, a turbine component (10), such as blade or vane, is shown in partial cross-section to illustrate the various layers (12-17) which may be applied to the metallic substrate (11).

The metallic substrate (11) is generally one of the nickel or cobalt base superalloys well known in the art. The examples discussed later used MAR-M247 alloy (which has a nominal composition of: 10% Co, 8.4% Cr, 0.65% Mo, 10% W, 3.3% Ta, 1.05% Ti, 5.5% Al, 1.4% Hf and minor amounts of Zr, C, and B in a nickel matrix) because it is commercially available in both the equiaxed and directionally solidified conditions for turbine airfoils. The present invention is also applicable when used in conjunction with the latest alloys which form single crystal airfoils. Such alloys are discussed in more detail in U.S. Pat. Nos. 4,209,348: 4,582,548: 4,643,782; and 4,719,080 which are incorporated herein by reference.

In accordance with present practice, the superalloy substrate (11) which is to be protected by ceramic coatings (14-17) must include a metallic bond coating (13) therebetween in order to provide an effective protection system.

The metallic bond layer (13) is usually comprised of a MCrAlY alloy. Such alloys have a broad composition of 10 to 35% chromium, 5 to 15% aluminum, 0.01 to 1% yttrium (or hafnium, lanthanum), with M, being the balance, being selected from the group consisting of iron, cobalt, nickel and mixtures thereof. Minor amounts of other elements such as Ta or Si may also be present. Such alloys are known in the prior art for use alone as a protective coating and are described in various U.S. Pat. Nos. including 3,542,530; 3,676,085: 3,754,903; 3,928,026: 4,005,989: 4,055,705: 4,339,509 and 4,743,514 which are incorporated herein by reference.

In the examples below, the bond coating (13) had a nominal composition of 23% Co, 18% Cr, 12% Al, and 0.3% Y with the balance nickel.

It is preferred that this MCrAlY layer be applied by electron beam vapor deposition. Such a deposition process in combination with peening and heat treating provides a dense adherent layer of relatively uniform thickness which is basically free from defects. While performance is approximately proportional to the thickness, generally 1-10 mils is suitable. Usually the MCrAlY surface is treated, by peening or polishing or the like, to have a smooth finish (less than 50 microinch roughness).

Other deposition processes may be employed for producing the MCrAlY layer including sputtering and low pressure plasma spraying, so long as they produce a thin, uniform thickness, high integrity coating of the desired composition.

The primary function of this MCrAlY layer is to form an oxide scale (14), i.e. a mixture of the elements of the bond layer combined with oxygen but predominately alumina, which grows very slowly and inhibits oxidation attack of underlying superalloy substrate (11) from the harsh operating environment in a gas turbine engine.

An important second function of this oxide scale (14) is to provide a good bonding surface for the adjacent ceramic layer. Alumina scales are chemically compatible with both the MCrAlY bond coat and the insulative zirconia layer.

Several approaches have been tried in order to extend the oxidation resistance and life of the MCrAlY coating layer (13). An early approach involved the addition of a diffusion aluminide interlayer (12) under the MCrAlY layer (13) within the outermost portion of the superalloy substrate (11). The diffusion aluminide coating provided additional aluminum for scale formation as discussed more fully in U.S. Pat. No. 4,005,989.

This invention also contemplates the optional use of a diffusion aluminide interlayer (12), which has good oxide adhesion on hafnium and/or zirconium containing superalloys, without the presence of an MCrAlY layer. Oxide adhesion may be promoted for coatings on superalloys which do not contain hafnium (or a similar element) by the use of more complex diffusion aluminide coatings containing additions of elements which promote oxide scale adhesion, such as Pt, Rh, Si, and Hf. Of course, such complex and expensive interlayers will only be used where necessary.

The diffusion aluminide interlayer (12) is usually applied by standard commercially available aluminide processes whereby aluminum is reacted at the substrate surface to form an aluminum intermetallic compound which provides a reservoir for the formation of an alumina oxidation resistant interlayer. Thus the aluminide interlayer (12) is predominately composed of aluminum intermetallic (e.g. NiAl, CoAl, and (Ni/Co)Al phases) formed by reacting aluminum vapor or aluminum-rich alloy powder with the substrate elements in the outer surface layers of the superalloy component. This layer is typically well bonded to the substrate. Aluminizing may be accomplished by one of several conventional prior art techniques, such as, the pack cementation process, spraying, chemical vapor deposition, electrophoresis, sputtering, and slurry sintering with an aluminum rich vapor and appropriate diffusion heat treatments. The aluminiding layer may be applied at a temperature from room temperature up to 2100° F. depending upon the particular aluminiding process employed. The aluminiding layer (12) is usually applied to a depth or thickness of about 1 to 5 mils.

Other beneficial elements can also be incorporated into diffusion aluminide coatings by a variety of processes. Beneficial elements include Pt, Si, Hf and oxide particles, such as alumina, yttria, hafnia, for enhancement of alumina scale adhesion, Cr and Mn for hot corrosion resistance, Rh, Ta and Cb for diffusional stability and/or oxidation resistance and Ni, Co for increasing ductility and/or incipient melting limits. These elements can be added to the surface of the component prior to aluminizing by a wide range of processes including electroplating, pack cementation, chemical vapor deposition, powder metal layer deposition, thermal spray or physical vapor deposition processes. Some methods of coating, such as slurry fusion, permit some or all of the beneficial coating elements, including the aluminum, to be added concurrently. Other processes, such as chemical vapor deposition and pack cementation, can be modified to concurrently apply elements such as Si and Cr with the aluminum. In addition, the diffusion aluminide coatings will contain all elements present within the surface layer of the substrate. In the specific case of platinum modified diffusion aluminide coating layers, the coating phases adjacent to the alumina scale will be platinum aluminide and/or nickel-platinum aluminide phases (on a Ni-base superalloy).

The alumina layer (14) may be formed by oxidizing the bond coating before the ceramic thermal barrier coating is applied or formed during application of the thermal barrier columnar grained coating. The initially sub-micron thick alumina scale will slowly thicken on the MCrAlY or aluminide surface during subsequent exposure of the component to normal turbine operating conditions. The initial thickness of the alumina scale is preferably sub-micron (up to about one micron).

Other, more recent, approaches to improving the bond between MCrAlY and the ceramic overcoat involve the addition of special ceramic interlayers between the two and/or minor, but critically important, modifications to the chemistry of the ceramic overcoat.

In the present invention, a small amount of titanium oxide is added to the first deposited portion of the ceramic overcoat (15) to enhance the bonding and slow the later growth of the alumina scale (14) on the MCrAlY layer (13).

The thermal barrier coating (16), which may be applied as the final coating layer is preferably a columnar grained ceramic (such as zirconia) which is applied to the underlying alumina film on the MCrAlY bond coat (or the optional aluminide coating if used alone) which is tightly bonded to the superalloy substrate. The columnar grains are oriented substantially perpendicular to the surface of the substrate with interstices, or at least porosity, between the individual columns extending from the surface of the thermal barrier coating down to or near (within a few microns) the alumina scale. Such a coating is highly effective in reducing the amount of heat transferred into the substrate.

The columnar grained structure of this type of thermal barrier coating minimizes any stresses associated with the difference in the coefficients of thermal expansion between the substrate and the thermal barrier coating which would otherwise cause a failure in a dense or continuous ceramic coating. When heated or cooled, the metallic substrate expands (or contracts) at a greater rate than the ceramic thermal barrier coating. Gaps between the ceramic columnar grains permit the grains to expand and contract without producing sufficient stress to induce spalling or cracking of the thermal barrier coating. This limits the stress at the interface between the substrate and the thermal barrier coating, thus reducing or preventing fractures in the ceramic coating.

The columnar grain thermal barrier coating (16) may be any of the conventional ceramic compositions used for this purpose. Currently the strain-tolerant zirconia coatings are believed to be particularly effective as thermal barrier coatings; however, other ceramic thermal barrier coatings are known. A preferred ceramic coating is zirconia stabilized with from 6% to 30%, and more preferably from 8% to 20%, yttria. These zirconia ceramic layers have a thermal conductivity that is about a factor of thirty lower than that of the typical nickel based superalloy substrate, such as MAR-M247. The zirconia may be stabilized with CaO, MgO, $CeO_2$ as well as $Y_2O_3$. Other ceramics which are believed to be useful as the columnar type coating materials include alumina, ceria, hafnia (yttria-stabilized), mullite, and zirconium silicate.

Naturally, the particular ceramic material selected for use as the columnar grain thermal barrier coating should be stable in the high temperature environment of a gas turbine engine and not be so heavy as to overstress rotating components. In addition, the outermost surface (17) of the ceramic may be densified (e.g. by lazer glazing, electrical biasing and/or titania doping) to improve resistance to erosion and molten salt deposits.

The ceramic layer (16) may be applied by any prior art technique which provides an open columnar microstructure, preferably the electron beam evaporation-physical vapor deposition process. The thickness of the ceramic layer may vary from 1 to 1000 microns but is typically in the 50 to 300 microns range for most thermal barrier applications.

The electron beam evaporation-physical vapor deposition process for applying the thermal barrier coating is a modification of the standard high-rate vapor deposition process for metallic coatings. Power to evaporate the ceramic coating material is provided by a high-energy electron beam gun focused onto a zirconia target. The zirconia vapor produced by evaporation of the zirconia target material condenses onto the turbine airfoil component to form the thermal barrier coating. Zirconia coating deposition rates are typically in the range of about 0.01 to 1.0 mil per minute. The parts to be coated are preheated in a load lock by either radiant or electron beam heat sources and/or heated in the coating chamber prior to exposure to the ceramic vapor. During coating, the component temperature is typically maintained in the 1500° to 2100° F. range. Since zirconia becomes somewhat oxygen deficient due to partial dissociation during evaporation in a vacuum, oxygen may also be bled into the yttria-stabilized zirconia vapor cloud to minimize any deviation from stoichiometry during coating.

Figure 2:
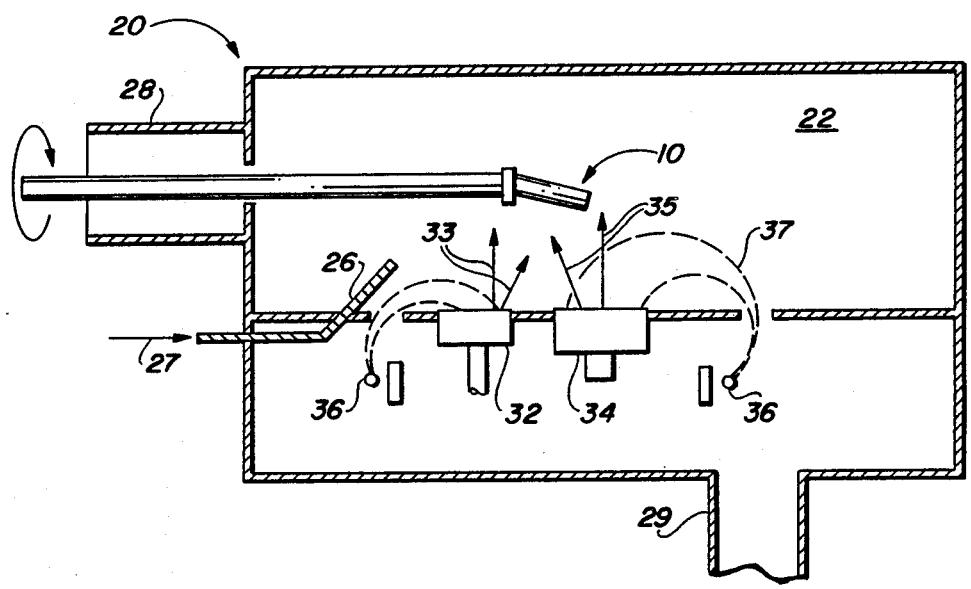
FIG. 2 is a schematic illustration of an apparatus suitable for carrying out the coating method of the present invention.

The method aspects of the present invention may be better understood by referring to FIG. 2 which schematically illustrates apparatus suitable for carrying out the invention.

The electron beam, physical vapor deposition (EB-PVD) apparatus (20) generally includes a vacuum chamber (22) surrounding the specimen to be coated (10), electron beam guns (36) and one or two target sources (34,32) of material to be evaporated and subsequently condensed onto the specimen (10). When used to apply the metallic MCrAlY bond coating, only one source (34) of the alloy is necessary. When used to apply the ceramic thermal barrier coatings, two sources are desirable. The primary source (34) is typically yttria stabilized zirconia while the secondary source (32) supplies any minor dopant elements, e.g. titanium, which oxidizes to titania during deposition.

In use, the chamber (22) is evacuated by vacuum pumps (not shown) connected at outlet (29) while a specimen (10) such as a turbine blade or vane is attached to a rotatable support rod (24) and inserted through airlock (28). Prior to coating, the component is preheated (with a radiant heater or secondary electron bean gun, which are not shown) to a temperature in the range of 900° to 1100° C. The electron gun (36) is energized to supply a stream of hot electrons (37) to the surface of the zirconia source (34) which causes zirconia vapors (35) to be evaporated and subsequently condensed onto the rotating specimen (10). Likewise, electrons heat the secondary source (32) causing vapors of titanium (33) to be ejected toward the specimen (10). To insure that the deposited vapors are fully oxidized, an oxygen rich gas (27) is usually supplied into the chamber (22) through a bleed tube (26).

EXAMPLES

Burner rig testing was used to quantify the cyclic oxidation resistance and thermal strain tolerance of the coatings of the present invention as compared to a prior art baseline coating. The test cycle heated coated specimens to 1150° C. for 27 minutes in a hot exhaust stream from a mach 0.3 burner followed by 3 minutes of forced air cooling. Specimens were examined twice daily for evidence of ceramic spalling. The coating was considered to have failed when 0.5 square centimeter of ceramic had spalled from the hot zone of the specimen. Temperatures of the hot specimens were carefully controlled with an optical pyrometer and thermocouples.

The baseline coating consisted of a MAR-M247 superalloy substrate (11) with an EB-PVD NiCoCrAlY bond coating (13), having a thin, thermally grown interfacial aluminum oxide scale (14) on its surface, covered by a columnar grained, 8 to 20 percent yttria stabilized zirconia insulative layer (17).

While several process variables (not related to the present invention) were found to have a small effect on the coating life, the typical baseline coating life ranged from 15 to 35 hours until spallation in the above burner rig tests.

Coatings of the present invention, which were similar to the above baseline coating but also contained relatively small amounts of titania (varying from about 0.1% to about 10% by weight) in the initially deposited interfacial yttria stabilized zirconia layer, had a burner rig life of about 66.5 hours, a significant increase over the prior art coatings.

While in order to comply with the statute, this invention has been described in terms more or less specific to one preferred embodiment, it is expected that various alterations, modifications, or permutations thereof will be apparent to those skilled in the art. For example, the coating system disclosed herein may be used in other turbine components such as seals and shroud linings or many other metallic components subjected to high temperature environments.

Therefore, it should be understood that the invention is not to be limited to the specific features shown or described but it is intended that all equivalents be embraced within the spirit and scope of the invention as defined by the appended claims.

What is claimed is:

1. An article of manufacture suitable for use at high temperatures in a gas turbine engine comprising:
   a nickel base superalloy substrate;
   a metallic, aluminum oxide forming bond coating on the substrate; said bond coating selected from the group consisting of MCrAlY, diffusion aluminides, and combinations thereof;
   an insulative, vapor deposited columnar grained ceramic coating on the metallic bond coating; and
   an interlayer between the bond coating and the ceramic coating which contains an oxide of titanium in a concentration of from about 0.1 to about 10 percent by weight.

2. The article of claim 1 wherein said ceramic coating is yttria stabilized zirconia and said interlayer is yttria stabilized zirconia doped with titania.

3. The article of claim 1 wherein said ceramic coating is selected from the group consisting of alumina, ceria, hafnia, mullite, yttria, zirconia and mixtures thereof.

4. The article of claim 1 further including a hard, dense exterior surface on the columnar grained ceramic coating.

5. A turbine component having an adherent, spallation-resistant, columnar-grained ceramic thermal barrier coating on at least a portion of its surface, said component produced by a method comprising the steps of:
   (a) providing a nickel-base superalloy substrate with a clean surface,
   (b) applying a thin, aluminum-containing, metallic bond coating onto at least a portion of said substrate surface,
   (c) applying a columnar-grained ceramic thermal barrier coating onto the metallic bond coating by an electron-beam, physical vapor deposition process, and
   (d) co-depositing about 0.1 to 10 percent by weight of titanium oxide into at least the portion of the ceramic coating adjacent the bond coating by vaporizing metallic titanium in an oxygen rich atmosphere simultaneously with the application of the ceramic thermal barrier coating.

6. A turbine component made by the method of claim 5 and characterized by having increased cyclic oxidation resistance compared to a similar component not containing titanium oxide in the ceramic coating.

7. The turbine component of claim 6 further characterized by having at least twice the thermal strain tolerance life compared to said similar component during a cyclic burner rig test at 1150° C.

* * * * *